July 31, 1956 M. ABRAMSON ET AL 2,756,485

PROCESS OF ASSEMBLING ELECTRICAL CIRCUITS

Filed Aug. 28, 1950

INVENTORS
STANISLAUS F. DANKO
MOE ABRAMSON
BY
Harry M. Saragovitz
ATTORNEY

United States Patent Office 2,756,485

Patented July 31, 1956

2,756,485

PROCESS OF ASSEMBLING ELECTRICAL CIRCUITS

Moe Abramson, Long Branch, and Stanislaus F. Danko, Neptune, N. J., assignors to the United States of America as represented by the Secretary of the Army Application August 28, 1950, Serial No. 181,906

6 Claims. (Cl. 29—155.5)

(Granted under Title 35, U. S. Code (1952), sec. 266)

This invention may be manufactured and used by or for the Government for governmental purposes without the payment to us of any royalty thereon.

This invention relates to the assembly of electrical circuits.

An object of this invention is to facilitate the assembly of electrical circuits, such as radio circuits.

A further object of this invention is to provide a new and improved method of electrical circuit fabrication which is adapted to the use of miniature components, or printed circuit components, or conventional components, or a combination of these various types of components.

A further object of this invention is to provide a method of electrical circuit assembly which combines the advantages of uniting individually prefabricated miniature components with conductors and the advantages of conductively coating a prefabricated printed circuit at the same time that framing elements are secured.

Commonly in this art heretofore, the purpose in dipping plates carrying printed circuits in a molten metal has been to apply to etched or deposited lines of copper a further coating of conductive material, usually silver containing a flux which makes it function like a solder. It is an advantage of my invention that the same kind of bath may be utilized in the main step to obtain a highly conductive coating on the base metal printed conductors, and at the same time utilize the dipping operation to additionally effect the securing of components which generally require respective assembly operations for their securement; and my invention also accomplishes by the same step the attachment of structural frame pieces by which a chassis assembly may be held together and held in place in the chassis proper. At the same time submergence of components in the hot molten metal, with the attendant liability of injury, is avoided, and by the peculiar sequence of steps the completion of conductive circuits and electrical and physical connection of the components and framing structure is effected by a single step.

Further objects and advantages of this invention will become apparent from a consideration of the following description.

In accordance with this invention a complete electrically wired equipment may be assembled by submitting the component parts to mass processing operations. The processing operations consist of the following: (1) Forming a metallic pattern on an insulating base, the pattern representing the wiring of the system; (2) Forming holes through the base member at appropriate locations on the wiring pattern to receive the circuit components; (3) Inserting the stand-off terminals of the electrical components into the appropriate holes in the wiring pattern, with the free ends of the terminals positioned at the patterned side of the base and the circuit components positioned at the unpatterned side; (4) With the patterned face downward, dipping the patterned face only of the base and the component terminals in a solder bath to connect all the components and leads to the patterned wiring circuit.

Figure 1:
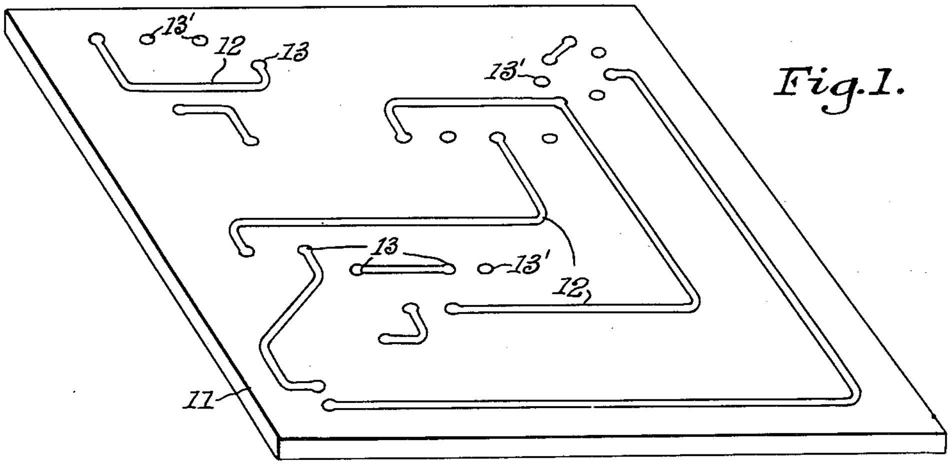
Figure 1 is a perspective view of a metallic circuit etched from a copper face deposited on a dielectric base or deck.

In fabricating the wiring pattern on the insulating base or deck which is to be multiplicated we prefer to employ the following steps. First, a drawing is made showing the layout of all the wire equivalent conductors in the overall circuit intended for a single support plate, base or deck. The drawing is then photographed on a sensitized zinc plate which is processed to form a printing plate for an off-set printing press. The base upon which the wiring diagram is to be printed may be formed as a laminated or solid phenolic material of electrical grade, melamine, fiber, vitreous material, or any insulating base to which copper or other metal foil can be laminated or a metallized pattern applied. A thin layer of copper or other metal foil is now applied securely to the circuit area of one face of the base or deck. The base is fed through the off-set printing press and the master pattern 12—13 printed on the metal surface with a resist ink or an ink which will accommodate for instance an acid resist, such as asphaltum, through subsequent dusting. The base may be further prepared by other resist treatments and heating operations before the foil etching operation. The printed laminate is then etched, by means of conventional etching procedures, to remove all the metal surface except the wiring outline which has been printed with acid resist.

Alternatively, other techniques may be employed prior to the etching step for preparing the wiring diagram as a resist pattern on the metal lamination overlying the insulating base. Such alternatives include photographic processes, spraying through a stencil, screening, hand-printing, and rubber stamping.

The resultant intermediate product is illustrated in Figure 1 wherein 11 represents the card-like support, base or deck, which is a plate or panel of insulating material. The metallic printed conductors 12 formed thereon terminate in connection points 13 at which holes 16 are punched. The holes may be punched by conventional multiple punching dies. Other small point areas 13' not necessarily included in wire-equivalent conductors are also printed, through which holes may be punched as required.

The necessary functioning electronic components 14 are provided with depending terminals 15 for insertion in the appropriate holes 16 at the connection points 13 and/or 13' on the circuit pattern. These components 14 may be tubes, capacitors, resistors, connectors, etc., or sub-assemblies such as filters, coupling networks, audio amplifier stages, etc. Such components are separately fabricated and their quality and performance established independently before assembly on the deck 11. These components may be of conventional size, or miniature or sub-miniature size, or may be printed circuit sub-assemblies, provided that depending terminals or other stand-offs are formed thereon of sufficient thickness and rigidity for insertion into holes 16 on the chassis, and when secured to constitute standards or stand-offs capable of sustaining the components clear of the base or deck under shocks to which such apparatus is liable.

Figure 2:
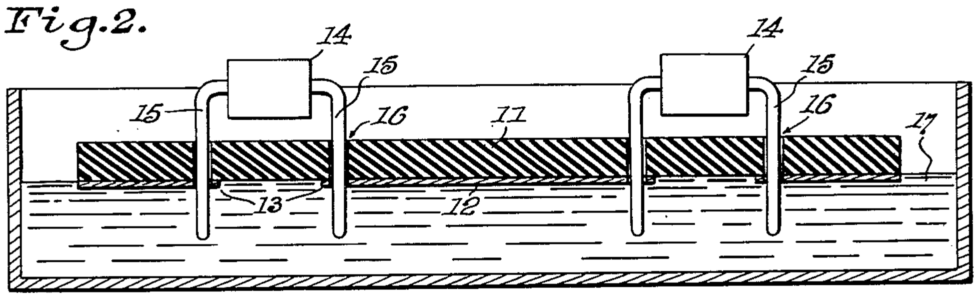
Figure 2 is a cross-sectional view illustrating the step of soldering the circuit components to the printed circuit.

As shown in Figure 2, the components 14 are positioned at the unpatterned side of the support panel or deck 11, with the terminals 15 extending through holes to adjacent the patterned side. Frictional engagement of the terminals with the sides of the holes 16 or the solder therearound is sufficient to hold the components in the positions in which they are adjusted in relation to the deck during the next following step. With the deck maintained in horizontal position, and with its patterned face downward, the assembly, with the component terminals placed as mentioned, is dipped in a flux and then momentarily dipped in a molten solder bath 17, to a depth with the top of the bath short of the top side of the deck, approximately as shown in Figure 2, the under face of the deck pressing against the molten metal. All the terminals 15—15' of the components 14 and any stand-off studs or connectors 20 set in the deck so dipped are thereby sweated to the metalized printed circuit and the printed circuit coated by the solder throughout the conductors and the spots 13'. The transient nature of the dip and the controlled temperature of the solder bath results in no impairment of the circuit elements, or the deck material. The components are thereafter supported securely in the position in which they were adjusted prior to the dip, and standoffs are secured so that they may thereafter be similarly secured in a second deck to support the first one as desired.

Following the solder dip the excess lengths of the terminals 15 which extend beyond the patterned surface of the chassis are clipped off.

In the circuit diagram, where one wire crosses over but does not electrically contact another wire such an arrangement cannot be formed on a printed circuit which is in one plane defined by a single face of the chassis. However, according to the present invention, a cross-over can be effected by using a U-shaped wire dropped into holes on the pattern to form the desired bridging arrangement. In such an arrangement, the U-shaped wire is handled as are the other components in the step of inserting the components into the appropriate holes in the printed pattern.

Figure 3:
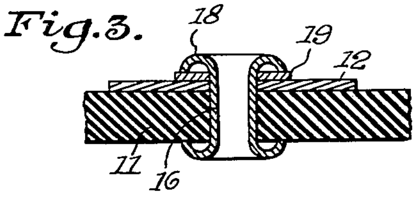
Figure 3 is a cross-sectional view illustrating an eyelet positioned in a hole on the circuit pattern to which a circuit component is to be secured.

Figure 3 illustrates an eyelet 18 at the point of connection of a particular component to the circuit pattern. The tinned eyelet 18 extends through hole 16 at the connection point and has turned-over lips formed at each of its ends. An annular tinned washer 19 may be provided beneath one lip of the eyelet to electrically connect the eyelet with and protect the metallic printed and etched but uncoated circuit 12. Eyelets are suitable at the structural connection points to physically reinforce the connection where the component to be supported there is heavy. In general, however, a simple perforation at the connection point is all that is required since the solder fillet shown in Figure 5 that forms there in the solder dipping step anchors the component in place.

Figure 4:
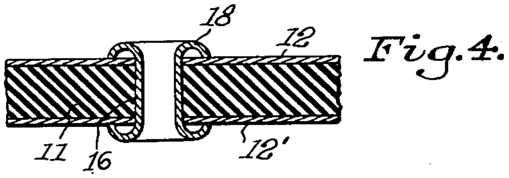
Figure 4 is a cross-sectional view showing an eyelet interconnecting printed circuits formed on both sides of the base.

Both sides of the insulating base may be formed with distinct circuit patterns, or two such bases each having a circuit diagram on one side only may be placed back to back. As shown in Figure 4, eyelets 18 may be used to electrically connect the oppositely positioned circuit patterns, so that a portion of the circuit diagram on one side of the base is joined to another portion of the circuit diagram on the other side. This can also be accomplished by a connector pin 20, as in Figure 5.

In both these arrangements, the top patterned side at which the components are to be positioned is first solder dipped so as to connect the eyelets or connector pins 20 to the metallic circuit on that side. Next, the components including cross-overs as required are "loaded" onto the base by positioning their terminals through the perforations provided in the base, the components themselves being positioned adjacent the side which has already been solder dipped and the component terminals positioned at the undipped side of the base. Next, this latter side is solder dipped so as to unite the component terminals thereto. It will be seen that this procedure facilitates the formation of cross-overs in the circuit diagram and enables the use of both sides of the deck for circuitry.

Figure 5:
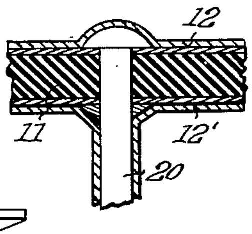
Figure 5 is a cross-sectional view showing a structural connector rod joining the printed circuits formed on both sides of the base.
Figure 6:
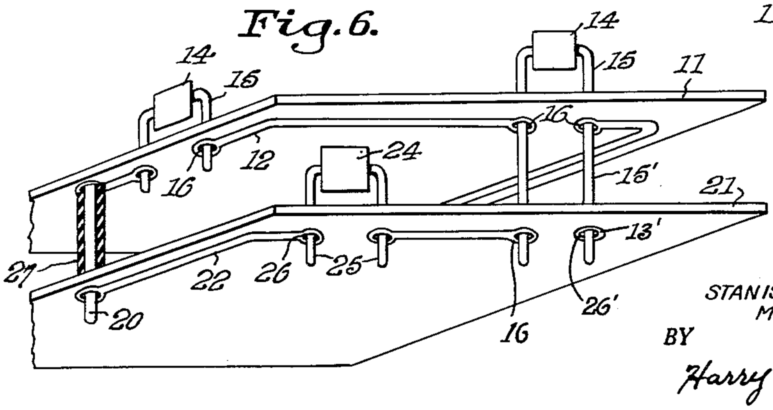
Figure 6 is a perspective view showing a multiple deck assembly according to the present invention.

Figure 6 illustrates an assembly manipulation according to be present invention which is advantageous when the circuit is too complex or the components are too bulky or heavy to be fitted onto a single base or deck. The circuit is partly on one base and the remainder on the other base. The first base, or upper deck, 11 is fabricated as indicated in the preceding description, with its components united to its circuit pattern to form a specific portion of the overall electrical system to be assembled. In order to electrically connect the first deck to the next deck, connector pins 20, such as shown in Figures 5 and 6, and/or extra length terminals 15' (Figure 6) on certain of the first deck components may be used. The second deck 21 is assembled with its components 24 in position for the next soldering step. Before the soldering step for the second deck the first deck is positioned above it, with the connector pins 20 and extra-length terminals 15' of certain of the first deck components extending into holes 26 formed in the second deck circuit pattern to receive them. In the next solder dipping step, these leads, along with the terminals 25 of the second deck components are soldered to the metallic circuit pattern 22 on the second deck, thereby electrically connecting the circuits of the first and second decks. Tubular dielectric spacers 27, shown in section in Figure 6, may be formed about the connector pins to assist in physically separating the decks. The decking steps can be extended to include any convenient number of decks.

By having the terminals 15—15' properly tinned as is conventional (for other reasons, such as prevention of oxidation, ready cleaning, and facility in the "taking" of solder when the component is attached to a conductor by soldering iron), when the terminals are inserted through the top printed and dipped pattern of an upper deck they may be frictionally held in the top conductor and its solder face with the solder around the opening 16 bindingly engaged against the tinned surface of the terminal, and when the dipping of the second patterned side of such upper deck occurs, with the level of the bath just at, or midway of the thickness of, the support or deck 11, the solder will "sweat" and extend itself up around the terminals within the holes 16 to and unite the solder on the top side of the deck to the terminal, forming a lock of this deck against movement in either direction on the terminal. This will enable an unusually strong physical connection and securing together of two spaced apart decks when the far part of such terminal and/or pin 20 is similarly secured in a second deck, with or without inclusion in a circuit on the second deck as indicated in Figure 6. Thus, without special or separate steps of assembly or fastening, these three results ordinarily involing as many separate operations are accomplished in the one dip of the lower deck.

It will be apparent that the multiple-deck assembly can be used to facilitate the physical support of bulky components which are to be included in the system. For example, in the case of a conventional tube socket, it may be desirable to mount the socket in the upper deck so that the directly engaged physical support for the socket is provided by the upper deck. The depending terminals of the socket extend into appropriate holes formed in the patterned lower deck for electrically connecting the socket to the wiring circuit upon soldering these terminals thereto. Other applications of this principle will suggest themselves to those skilled in the art.

It will be understood that where a multiple-deck assembly, such as is illustrated in Figure 6, is not adequate to contain the entire circuit it is simple to interconnect a plurality of such multiple-deck assemblies in accordance with the teaching of our invention. This may be accomplished by forming the connectors 20 for interconnecting such assemblies as components in each assembly, each such connector preferably being mounted between the decks of its assembly and surrounded by or embedded in dielectric spacers separating the decks (such as shown at 27 in Figure 6) to impart further rigidity and strength to the connection.

The components such as those 14 and 24 may be distinguished from the purely structural components where necessary by the designation "electrical component" or "circuit component."

What is claimed is:

1. In the method of assembling an electrical circuit comprising first and second dielectric panels, circuit components for said panels, and panel-connecting pins; the steps of forming a solder-adherent pattern including a conductive circuit pattern on one side of said first panel, forming holes through said panel at predetermined points on said pattern including holes in conductors of said conductive circuit pattern, inserting the terminals of certain ones at least of said first panel components through predetermined holes in conductors in said conductive circuit pattern on said first panel from the unpatterned side to the patterned side, said predetermined holes at least being of a size in relation to said terminals such that a permanent solder connection will be formed between inserted terminals and immediately adjacent parts of said pattern when the pattern and inserted terminals are dipped in molten solder, by adhesion and cohesion of the solder, inserting said pins through other predetermined holes on said first panel with the pins fitting such holes and protruding from the patterned side, and immersing the patterned side of said first panel in a solder bath whereby said pins and said first panel component terminals are electrically and mechanically joined to said pattern; forming a second circuit pattern on one side of said second panel, forming holes through said second panel at predetermined points on said second pattern, inserting the terminals of said second panel components through predetermined holes on said second panel from the unpatterned side to the patterned side, bringing the first panel and assembled said assembled components and said assembled pins into predetermined spaced relation with the unpatterned side of the second panel, inserting said pins of the said first panel through other predetermined holes on said second panel with the pins protruding from the patterned side, positioning the assembled two panels with the first panel above the other, and the second panel in horizontal position with its patterned side downward and immersing the patterned side of said second panel in a solder bath with the top level of the bath below said second panel components, whereby the pins and the second panel component terminals are electrically and mechanically joined to said second conductive pattern and the two panels secured together and fixed in spaced relation.

2. A method of combined electrical circuit production and plural deck framing, which comprises the steps of forming on one face at least of a first insulator panel a solder-adherent first pattern comprising principally an electrically conductive first circuit pattern of conductors defining a portion of a major circuit, forming holes through the first panel at predetermined locations on said pattern including holes in conductors in said pattern of conductors for the connection of first panel component terminals, inserting terminals of first panel components including stand-offs as required through said holes with the electrical components positioned adjacent but spaced from the side of the panel opposite said first pattern and free ends of the terminals exposed through said first pattern, and dipping the panel with said first pattern faced downward in a solder bath to a depth to submerge said first pattern, but short of contact of bath and said electrical components so as to solder said first panel component terminals to the said first pattern; forming a solder-adherent second pattern principally defining a second circuit composed principally of conductors of another portion of said major circuit on one side of a planiform second insulation panel, forming holes through the second panel at predetermined locations on the second panel, including parts of said second circuit pattern, for the insertion therethrough of terminals of second circuit components and forming other openings through the second panel for the insertion of the extreme parts of certain said stand-offs of said first panel, inserting terminals of the second circuit components and the extreme parts of certain said stand-offs of the first panel through selected said holes in the second panel with the second pattern faced away from the first panel and with the second circuit components between and spaced from the first and second panels and the free ends of both the second circuit component terminals and the said certain stand-offs exposed through the said second pattern, positioning the so-assembled panels and components with the second panel horizontal and below the remainder of the whole assembly, its said second pattern exposed downwardly, and dipping the said second pattern and said terminals exposed therethrough in a solder bath to a depth with the top level of the bath at least at said second pattern on the second panel but below the said second circuit components located between the panels, thus simultaneously conductively coating the second pattern, uniting the second circuit component terminals and said certain first panel component terminals to the second pattern, securing the two panels together in mutual supporting relation, connecting the two said portions of a major circuit coactively together, and supporting the second circuit components in space between the panels.

3. A method of electrical circuit assembly which comprises the steps of forming a metallic solder-adherent pattern including an electrically conductive pattern defining a portion of an electrical circuit diagram on one face of a first dielectric panel, thereby constituting a first patterned face, forming holes through the panel at predetermined locations on said pattern for the connection of first panel components including electrical circuit components to said pattern, inserting solder-adherent terminals of first panel components through said holes with the electrical components supported thereby and positioned adjacent the face of the panel opposite said pattern and the free ends of the terminals positioned in the said pattern, forming certain said terminals longer and projecting them in the same direction through and far beyond said patterned face, dipping said first panel with said first patterned face downward and the free ends of all said terminals and said first pattern in a solder bath to a depth short of contact of said electrical components with said bath, so as to unite all said free ends to the said pattern; forming a metallic solder-adherent second pattern including a second conductive pattern defining a portion of an electrical circuit diagram on one face of a second dielectric panel thereby constituting a second patterned face, forming holes through the second panel at predetermined locations in the second pattern for the connection of second pattern electrical circuit components to said second pattern and for connecting certain terminals of first panel components to said second pattern, inserting solder-adherent terminals of second panel electrical components in respective holes in the second panel and through said second pattern with the second panel electrical components positioned above the second panel opposite said second patterned face, inserting in the same direction the said longer terminals of first panel components through the second panel with the free ends of all terminals so inserted through the second panel exposed at the said second patterned face, and dipping the second panel with said second patterned face downward and the ends of all terminals inserted therethrough as aforesaid in a solder bath to a depth with a surface of said bath at said second patterned face and the top level of the bath parallel to the last named patterned face but short of the said second panel electrical components, and withdrawing the assembly from the bath, so as to conductively unite certain at least of said last named terminals with said second conductive pattern and simultaneously structurally connect the two panels in fixed mutual relation.

4. A method of electrical circuit fabrication which comprises the steps of forming a first pattern of metal including conductors in an electrically conductive pattern defining a portion of an electrical circuit diagram on one side of a first dielectric panel, said side constituting a patterned side of said panel, forming holes through the first panel and said metal at predetermined locations including holes in conductors in the conductive pattern, inserting terminals of first panel components through predetermined said holes with the components positioned at the side of the first panel opposite said first pattern and the free ends of the terminals close to the pattern metal abutting the holes for solder-joining thereto and positioned at conductors on the said first pattern of the first panel, inserting connective metal pins through other predetermined holes so as to fit the same and project from the patterned side of said panel, and soldering the first panel component terminals and the connective pins to the conductive pattern on the first panel by submerging the said first pattern in a solder bath to a depth with the top level of the bath spaced below said components; forming a second pattern of metal including an electrically conductive pattern including conductors defining part of an electrical circuit diagram on one side of a second dielectric panel and constituting a panelled side of the latter, forming holes through the second panel and said metal at predetermined locations including conductors on the conductive pattern, inserting terminals of second panel components through apertures in the conductive pattern of the second panel, inserting terminals of certain first panel components and said connective pins through certain said holes in the second panel with the said first panel positioned in operative spaced relation to the said second panel and with the free ends of the second panel component terminals, the free ends of the certain first panel component terminals and extremities of the connective pins exposed at the patterned side of the second panel in close relation to the metal of said second pattern for solder-joining thereto and positioning the second panel components spaced above the unpatterned side of the second panel, positioning the two said panels so assembled in predetermined spaced relation and with the second panel below the other and in horizontal position with its said patterned face presented downward, dipping the patterned side of the second panel in a bath of molten solder with the top level of the bath parallel thereto and below the second panel components, whereby to simultaneously unite the inserted first panel component terminals and connective pins with the said second pattern, conductively coat the said second pattern, solder said second panel component terminals to said second pattern, and structurally connect the two panels together in fixed spaced relation.

5. The method of rapidly assembling and electrically connecting printed circuits and circuit components and connecting to printed patterns and structural panels the component lead terminals and also so connecting structural connectors for mounting panel units; which comprises the steps of printing on a card-like planiform panel of nonconductive material having a first principal face normally incompatible with electrical metallic solder a design on said face consisting of solder-adherent material and constituting principally a conductor pattern of the conductors complete for a given area of a circuit diagram except for attachable components, forming holes through the panel normal to said face at terminations of conductors of said conductor pattern for reception therethrough of stand-off members including terminals of electrically functioning components and structural connectors, and forming holes through points on the panel remote from terminations of conductors in said pattern for reception of certain other stand-off members including structural connectors as required, preforming components with fixed included solder-adherent terminals constituting stand-off members extended in one general direction therefrom, emplacing electrically functional components of said circuit diagram adjacent a second principal face of the panel opposite said design, inserting as required and temporarily fixing said stand-off members of the electrically functional components in certain said holes with the components spaced from the panel, and inserting portions of stand-off members including as required structural stand-offs for panel mounting in certain said holes, with parts of the inserted members exposed at said first face and said design, said holes and said inserted portions being of a size whereby a permanent solder connection will be formed by adhesion and cohesion of the solder between the said inserted portions and parts of said design abutting said holes when the design and said assembled parts are dipped in molten solder, supporting said panel in horizontal position with said exposed parts and design presented downwardly, and dipping said exposed parts, design and second face of the panel briefly in a bath of molten solder having a top surface area at least coextensive with the superficial area of said first face of the panel and accommodated to the boundary form of the panel, to a depth with the top level of the bath parallel to and at least at the said design but short of said second face of the panel, so as to simultaneously unite said exposed parts and said design and unite all said stand-off members to said panel, and removing the dipped panel from the bath before material conduction of heat from the bath to the said electrically functional components through the component terminals.

6. The method as in claim 5 including, for the structural connection of a plurality of panels as superposed spaced decks, the further steps of forming on at least a second panel of the kind first named a solder-adherent design on one face thereof constituting a second conductor pattern of the conductors complete for a second area of a cricuit diagram except for crossovers and electrically functional components, forming holes through the second panel at predetermined parts of conductors of the second pattern and in structural parts of the second panel, fixing on said face of the second panel solder-adherent material at certain said holes, as required, emplacing electrically functional components of said second area of the circuit diagram adjacent the face of the second panel opposite the said second pattern, inserting leads of the last named components in certain of said holes in the second panel exposed at said second pattern and temporarily so fixing the same therein, inserting and temporarily fixing certain said stand-off members of the first panel in certain of said holes in the second panel, supporting both said panels in horizontal positions and fixed mutually spaced relation with the second panel below the other panel, with said one face of the second panel presented downwardly, and dipping the said face of the second panel only and exposed extremities of said leads and stand-off members at the second pattern briefly in a bath of solder to a depth with the top level of the bath short of the second named electrically functional components emplaced over the second panel, so as to simultaneously unite said certain stand-off members of the first panel to the second panel, and unite leads of the second named components with the conductors of the second pattern and the second panel.

References Cited in the file of this patent

UNITED STATES PATENTS

| | | |
|---|---|---|
| 1,783,642 | Fergusen | Dec. 2, 1930 |
| 1,837,962 | Hensgen | Dec. 22, 1931 |

| | | |
|---|---|---|
| 2,066,876 | Carpenter et al. | Jan. 5, 1937 |
| 2,270,166 | Hiensch | Jan. 13, 1942 |
| 2,474,988 | Sargrove | July 5, 1949 |
| 2,492,236 | Mydlil | Dec. 27, 1949 |
| 2,502,291 | Taylor | Mar. 28, 1950 |
| 2,512,162 | Lips | June 20, 1950 |
| 2,607,821 | Van Arsdell | Aug. 19, 1952 |

OTHER REFERENCES

Printed Circuit Techniques, National Bureau of Standards Circular 468, Nov. 15, 1947.